(12) United States Patent
Lan et al.

(10) Patent No.: US 7,006,027 B2
(45) Date of Patent: Feb. 28, 2006

(54) DIGITAL-TO-ANALOG CONVERTER WITH SECONDARY RESISTOR STRING

(75) Inventors: Shiming Lan, Tokyo (JP); Toshio Teraishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/074,692

(22) Filed: Mar. 9, 2005

(65) Prior Publication Data

US 2006/0007028 A1    Jan. 12, 2006

(30) Foreign Application Priority Data

Jul. 8, 2004    (JP)    .............................. 2004-202409

(51) Int. Cl.
*H03M 1/66*    (2006.01)

(52) U.S. Cl. ...................................... 341/144; 341/154

(58) Field of Classification Search ................ 341/144, 341/145, 154, 153, 159, 118, 119, 120, 121; 708/7
See application file for complete search history.

(56) References Cited

U.S. PATENT DOCUMENTS

| | | | | | |
|---|---|---|---|---|---|
| 5,252,975 | A | * | 10/1993 | Yuasa et al. | 341/145 |
| 5,343,199 | A | * | 8/1994 | Sugawa | 341/159 |
| 5,495,245 | A | * | 2/1996 | Ashe | 341/145 |
| 5,619,203 | A | * | 4/1997 | Gross et al. | 341/144 |
| 5,703,588 | A | * | 12/1997 | Rivoir et al. | 341/159 |
| 6,373,419 | B1 | | 4/2002 | Nakao | |
| 6,400,300 | B1 | * | 6/2002 | Leung et al. | 341/154 |

FOREIGN PATENT DOCUMENTS

| | | |
|---|---|---|
| JP | 62-024713 | 2/1987 |
| JP | 2000-183747 | 6/2000 |

* cited by examiner

*Primary Examiner*—Brian Young
(74) *Attorney, Agent, or Firm*—Donald R. Studebaker; Nixon Peabody LLP

(57) ABSTRACT

A digital-to-analog converter generates a monotonic sequence of reference voltages and selects an arbitrary pair of reference voltages, adjacent in the monotonic sequence. One of the selected reference voltages is supplied through a resistor and a switching device, connected in series, to the output terminal of the converter. The other selected reference voltage is supplied through another resistor and another switching device, connected in series, to the same output terminal. This arrangement saves space, and enables variations in the output voltage levels to be kept within tolerance by use of resistors with sufficiently high resistance values.

23 Claims, 3 Drawing Sheets

DIGITAL-TO-ANALOG CONVERTER WITH SECONDARY RESISTOR STRING

BACKGROUND OF THE INVENTION

1. Field of the Invention

The present invention relates to a digital-to-analog converter useful in, for example, a circuit that drives a liquid crystal display.

2. Description of the Related Art

With the recent increase in the size of liquid crystal display devices, various needs have arisen for improved performance in their driving circuits. One need is for a gradation scale with more gradation levels, especially for the display of more vivid colors. The current state of the art is a liquid crystal display device that can reproduce over one billion different colors by using ten bits of data (1024 gradation levels) for each of the three primaries (red, green, blue). The increased number of gradation levels demands improved performance from the digital-to-analog (D/A) converters that convert digital signals received from an outside source to analog signals. D/A converters of the resistor string type are often employed.

The simplest resistor string D/A converters have the structure shown in FIG. 3, which converts two-bit digital data (bits 1D and 2D and their complementary values 1DB and 2DB), and FIG. 4, which converts three-bit digital data (bits 1D–3D and their complementary values 1DB–3DB). An output decoder comprising transistor switches selects one of the voltage levels ($V_0$, $V_1$, $V_2$, . . . ) generated by the resistor string ($R_1$, $R_2$, . . . ) for output ($V_{out}$). With this circuit configuration, each time the number of bits increases by one, the number of resistors and transistors substantially doubles, doubling the circuit area.

Japanese Patent Application Publication No. 2000-183747 (U.S. Pat. No. 6,373,419) describes an alternative circuit configuration with fewer resistors and transistors, but the output decoder requires an averaging voltage-follower amplifier with two parallel differential input stages, an arrangement that consumes an undesirably large amount of current.

Japanese Patent Application Publication No. 62-024713 describes a different circuit configuration in which the number of transistors and resistors increases more slowly with the number of bits, but this configuration tends to produce voltage level fluctuations when several hundred output decoders are connected in parallel to the same resistor string, as is the case in circuits for driving large liquid crystal displays.

SUMMARY OF THE INVENTION

An object of the present invention is to provide a D/A converter that has a reduced number of circuit elements, does not consume excessive current, and can provide stable output voltage levels.

The invented D/A converter includes a voltage generator that uses voltage drops in resistors to generate a plurality of reference voltages forming a monotonic sequence of voltage levels. A first control circuit and a second control circuit select two of the reference voltages, mutually adjacent in the monotonic sequence, as a first output and a second output. A third control circuit generates a third output from the first and second outputs. The third control circuit includes a first resistor and a first switching device connected in series between the first output and the third output, and a second resistor and a second switching device connected in series between the second output and the third output.

Compared with the simplest conventional type of resistor string D/A converter, the invented D/A converter takes up less space because it requires fewer resistors and transistors. Moreover, the invented D/A converter does not require amplifiers that consume excessive current, and its output voltage fluctuations can be reduced to an arbitrary level by suitable selection of the resistance values of the resistors in the third control circuit.

DETAILED DESCRIPTION OF THE INVENTION

Figure 1:
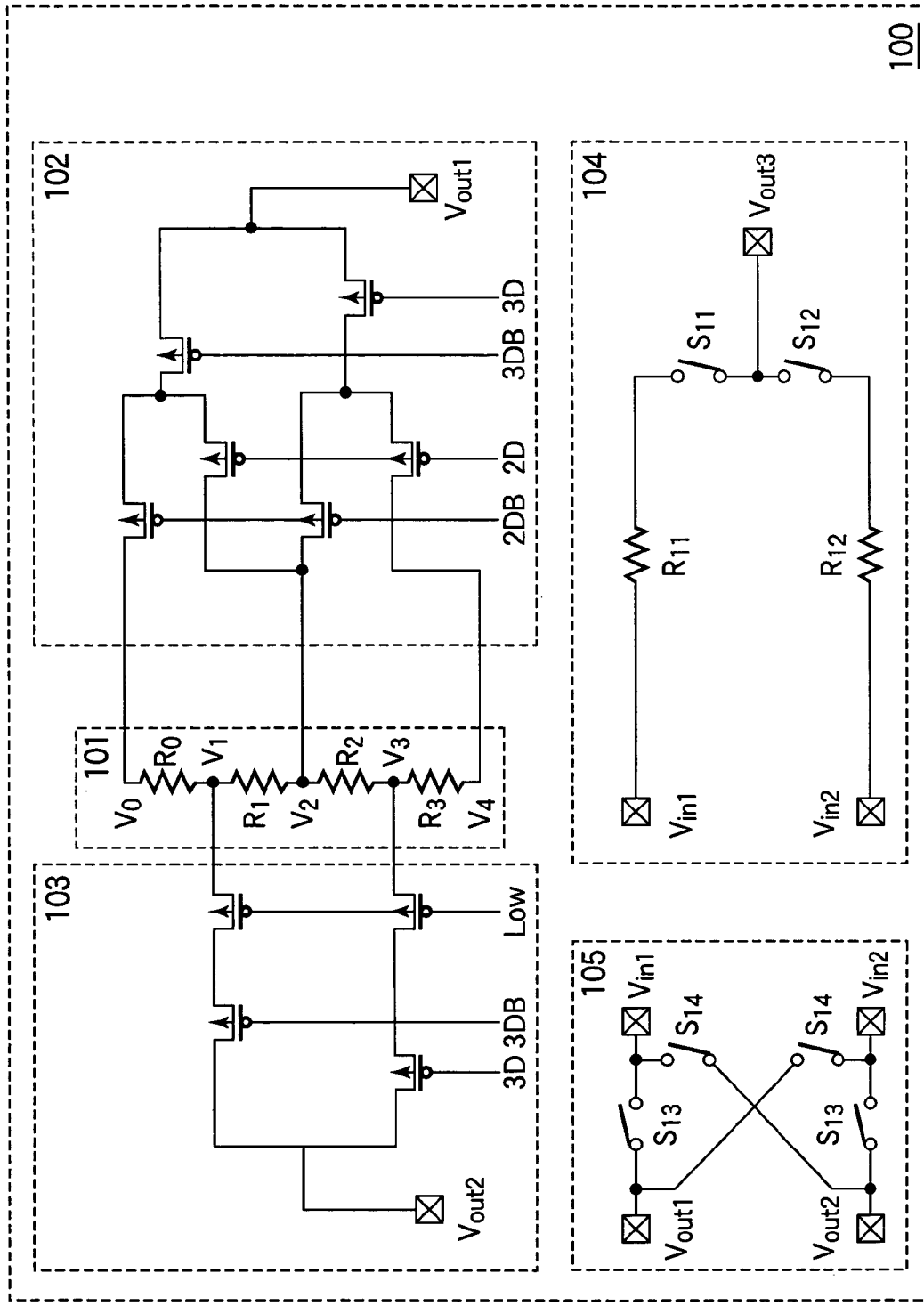
FIG. 1 is a circuit diagram of a D/A converter illustrating a first embodiment of the present invention.

Embodiments of the invention will now be described with reference to the attached drawings, in which like elements are indicated by like reference characters.

First Embodiment

The first embodiment is a D/A converter that converts n-bit digital data to an analog signal. Referring to FIG. 1, the D/A converter 100 comprises a voltage generator 101 and three control circuits 102, 103, 104. The illustrated circuit converts three-bit digital data comprising bits 1D, 2D, 3D and their complementary values 1DB, 2DB, 3DB.

The voltage generator 101 is a string of resistors ($R_0$, $R_1$, $R_2$, $R_3$) connected in series, receiving a voltage $V_0$ from a power source (not shown) and generating successively lower voltages ($V_1$ to $V_4$) by resistive voltage drops. Voltages $V_0$ to $V_4$ will be referred to below as reference voltages. In general, if n is the number of bits of digital input data, the voltage generator 101 in the first embodiment has $2^{n-1}$ resistors generating $2^{n-1}+1$ reference voltages.

The first control circuit 102 uses the upper two bits of input data (2D, 3D and their complementary values 2DB and 3DB) to select one of the even-numbered reference voltages ($V_0$, $V_2$, or $V_4$) as a first output $V_{out1}$. In general, the upper n−1 bits of input data are used to select an even-numbered one of the $2^{n-1}+1$ reference voltages generated by the voltage generator 101.

The second control circuit 103 uses the most significant bit (3D and its complementary value 3DB) to select an odd-numbered reference voltage ($V_1$ or $V_3$) adjacent to the even-numbered reference voltage selected by the first control circuit 102, and outputs it as a second output $V_{out2}$. In general, the upper n−2 bits are used to select an odd-numbered one of the $2^{n-1}+1$ reference voltages generated by the voltage generator 101.

The first control circuit 102 and second control circuit 103 may be any types of control circuits that can select two mutually adjacent reference voltages. They are not limited to the circuit configurations shown in FIG. 1.

The first and second outputs $V_{out1}$ and $V_{out2}$ are supplied as first and second inputs $V_{in1}$ and $V_{in2}$ to the third control circuit 104, which generates a third output $V_{out3}$. In the third control circuit 104, a first resistor $R_{11}$ and first switch $S_{11}$ are connected in series between the first input $V_{in1}$ and third output $V_{out3}$. Similarly, a second resistor $R_{12}$ and second switch $S_{12}$ are connected in series between the second input $V_{in2}$ and third output $V_{out3}$. The first and second switches $S_{11}$, $S_{12}$ are controlled by the least significant bit of the digital input data (1D and its complementary value 1DB, not shown). The first and second resistors $R_{11}$ and $R_{12}$ have identical resistance values.

Here and in the description of the second embodiment, the term 'identical' means that the two resistance values are the same to within a tolerance that allows for normal fabrication process variations. As the number of voltage gradations increases, the voltage difference between the first and second outputs $V_{out1}$ and $V_{out2}$ decreases, so the error caused by process variations can be tolerated.

The switching circuit 105 has first and second input terminals that receive the outputs $V_{out1}$ and $V_{out2}$ from the first and second control circuits 102, 103; first and second output terminals that supply the first and second input voltages $V_{in1}$ and $V_{in2}$ to the third control circuit 104; and switches $S_{13}$, $S_{14}$ that can connect either input terminal to either output terminal. The switches $S_{13}$, $S_{14}$ are controlled by the second least significant bit (2D and its complementary value 2DB) of the digital input signal.

The switches $S_{11}$, $S_{12}$, $S_{13}$, $S_{14}$ in the third control circuit 104 and switching circuit 105 are analog switching devices comprising metal-oxide-semiconductor (MOS) transistors (not shown).

The values of the first and second resistors $R_{11}$ and $R_{12}$ are determined by taking into account the on-resistances of the MOS transistors in the first and second control circuits 102 and 103 and the input capacitance of the amplifier (not shown) connected to the third output $V_{out3}$.

The first and second control circuits 102 and 103 obtain the first and second outputs $V_{out1}$ and $V_{out2}$ by selecting a path that leads through, in each case, just n–1 p-channel MOS transistors. The total on-resistance of the selected MOS transistors in the first and second control circuits 102 and 103 is therefore the sum of the on-resistances of n–1 MOS transistors. In the present example (n=3), the total on-resistance is the sum of the on-resistances of two MOS transistors. To provide the same total on-resistance as in the first control circuit 102, the second control circuit 103 includes transistors that are kept permanently turned on by holding their gate electrodes at the low logic level.

The sizes of the MOS transistors controlled by bits 1D or 1DB, 2D or 2DB, and 3D or 3DB increase in this order, the corresponding on-resistances decreasing accordingly.

In a D/A converter used in, for example, a liquid crystal display driver, some two hundred output channels, each including the control circuits 102, 103, 104 shown in FIG. 1, may be connected in parallel to a single resistor string 101. To hold the voltage error caused by variation of the reference voltages generated by the resistor string under varying output conditions to less than one percent (1%), the resistance RC of resistors $R_{11}$ and $R_{12}$ must satisfy the condition $100 \cdot X \cdot RA \leq RB+RC$, where X is the number of channels, RA is the resistance of a resistor in the resistor string, and RB is the total on-resistance of the MOS transistors on the selected path in the first control circuit 102 or second control circuit 103.

When switches $S_{11}$ and $S_{12}$ are both turned on, the first and second control circuits 102, 103 and first and second resistors $R_{11}$ and $R_{12}$ form a series circuit connected in parallel with one of the string resistors, so the resistance RC of the first and second resistors $R_{11}$ and $R_{12}$ must also satisfy the condition $100 \cdot X \cdot RA \leq 2(RB+RC)$. When there are two hundred channels (X=200), for example, the total series resistance of the first and second resistors $R_{11}$ and $R_{12}$ and the first and second control circuits should be about ten thousand times higher than the resistance RA of a resistor in the resistor string.

If operating speed is taken into account, the input capacitance of the amplifier (not shown) connected to the output stage of the D/A converter needs to be considered. If the input capacitance of the amplifier is denoted C, the rise time (the time taken for the input voltage to reach 90% of the desired value) is (ln10)(RB+RC)C, where ln10 denotes the natural logarithm of ten. The combined series resistance of the first control circuit and first resistor must therefore be equal to or less than $T_{rise}/(C \cdot \ln 10)$, where $T_{rise}$ is the maximum allowable rise time. If the maximum allowable rise time is one microsecond (1 μs), for example, and C is expressed in microfarads (μF), the necessary condition becomes $1 \geq (\ln 10)(RB+RC)C$; that is, the required operating speed is obtained if the resistance values RB and RC satisfy the condition:

$$RB+RC \leq 1/(C \cdot \ln 10).$$

The allowable variation of the reference voltages generated by the voltage generator 101 differs depending on the circuit specifications. If the allowable variation is Y percent, then the resistance RC of resistors $R_{11}$ and $R_{12}$ should be selected so that the series resistance RB+RC is within the following range:

$$(50/Y) \cdot X \cdot RA \leq RB+RC \leq 1/(C \cdot \ln 10)$$

Next the operation of the first embodiment will be described.

The first control circuit 102 selects an even-numbered reference voltage as the first output voltage $V_{out1}$, according to digital input data 2D, 2DB, 3D, and 3DB. The second control circuit 103 selects an odd-numbered reference voltage as the second output voltage $V_{out2}$, according to digital input data 3D and 3DB. The first control circuit 102 and second control circuit 103 are configured so as to assure that the selected first and second outputs $V_{out1}$ and Vou2 are mutually adjacent in the series of reference voltages generated by the voltage generator 101.

When the least significant bit of the input data is zero (1D=0), the first switch $S_{11}$ in the third control circuit 104 is turned off, the second switch $S_{12}$ is turned on, and the second input $V_{in2}$ is output as the third output $V_{out3}$. When the least significant bit is one (1D=1), both the first and second switches $S_{11}$ and $S_{12}$ are turned on. Since the total on-resistances of the MOS transistors on the selected paths in the first and second control circuits are the same and the first and second resistors $R_{11}$ and $R_{12}$ have mutually identical resistances, a voltage halfway between the first and second inputs $V_{in1}$ and $V_{in2}$ is output as the third output $V_{out3}$.

When the middle bit of the input data is zero (2D=0), switches $S_{13}$ are turned on and switches $S_{14}$ are turned off in the switching circuit 105, connecting the first output $V_{out1}$ to the first input $V_{in1}$ and the second output $V_{out2}$ to the second input $V_{in2}$. When the middle bit of the input data is one (2D=1), switches $S_{13}$ are turned off and switches $S_{14}$ are turned on, connecting the first output $V_{out1}$ to the second input $V_{in2}$ and the second output $V_{out2}$ to the first input $V_{in1}$. This switchover causes the third output $V_{out3}$ to increase monotonically from $V_4$ to $(V_0+V_1)/2$ as the digital input increases from '000' to '111', as shown in Table 1.

TABLE 1

| Input | $V_{out1}$ | $V_{out2}$ | $V_{out3}$ |
|---|---|---|---|
| 111 | $V_0$ | $V_1$ | $(V_0 + V_1)/2$ |
| 110 | $V_0$ | $V_1$ | $V_1$ |
| 101 | $V_2$ | $V_1$ | $(V_1 + V_2)/2$ |
| 100 | $V_2$ | $V_1$ | $V_2$ |
| 011 | $V_2$ | $V_3$ | $(V_2 + V_3)/2$ |
| 010 | $V_2$ | $V_3$ | $V_3$ |
| 001 | $V_4$ | $V_3$ | $(V_3 + V_4)/2$ |
| 000 | $V_4$ | $V_3$ | $V_4$ |

Figure 3:
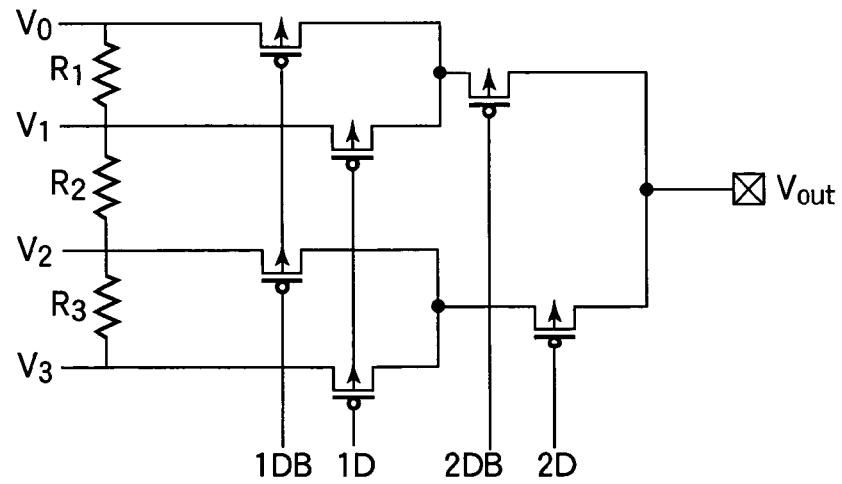
FIG. 3 is a circuit diagram of a conventional two-bit D/A converter.
Figure 4:
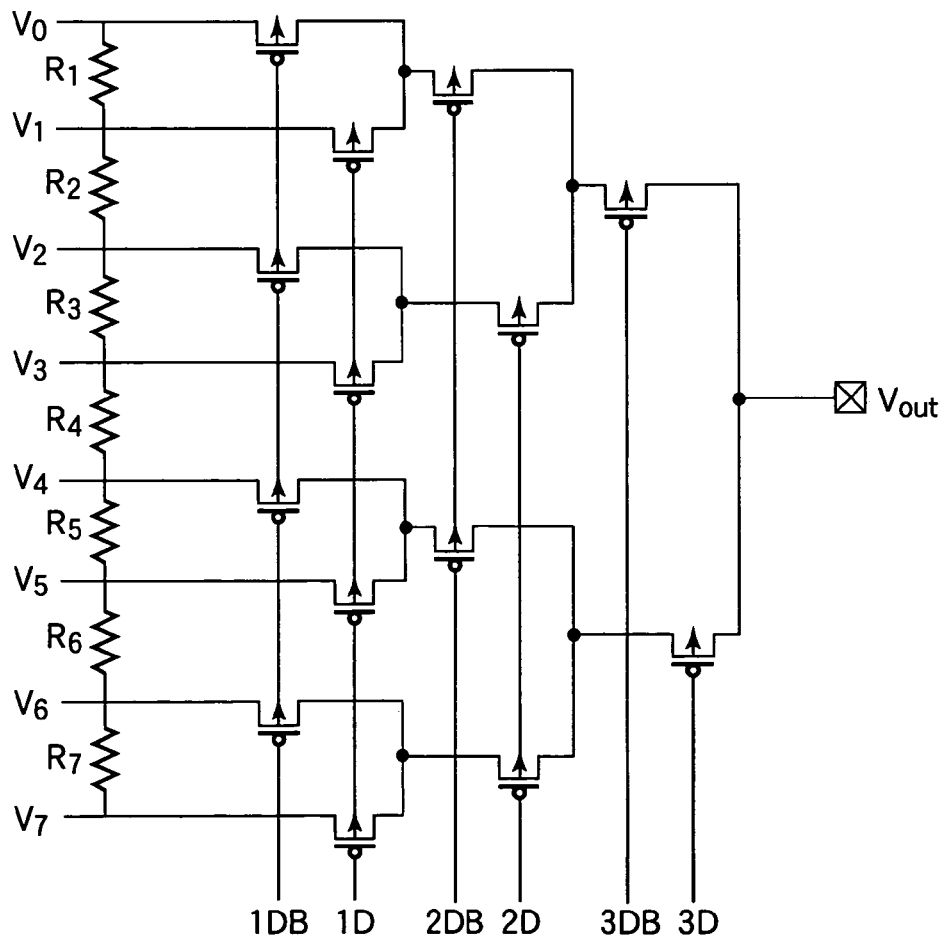
FIG. 4 is a circuit diagram of a conventional three-bit D/A converter.

As Table 1 shows, the first embodiment produces the same number of output voltage gradations as the conventional D/A converter shown in FIG. 4, using a resistor string with only about half as many resistors. More precisely, the first embodiment requires a string of $2^{n-1}$ resistors, as noted above, whereas the conventional circuits shown in FIGS. 3 and 4 require a string of $2^n-1$ resistors.

When the first embodiment is adapted to convert n-bit input data (n>3), the first and second control circuits 102, 103 require additional transistors, but the switching circuit 105 and third control circuit 204 do not. For large numbers of bits (n=10, for example), the first embodiment requires fewer transistors in all than a conventional D/A converter of the type shown in FIGS. 3 and 4, and also requires fewer resistors in all, even if there are two hundred output channels with two resistors $R_{11}$, $R_{12}$ apiece in addition to the single resistor string in the voltage generator 101.

The above advantages become increasingly pronounced as the number of bits increases.

In addition, the resistance values in the third control circuit 104 can be selected to hold variations in the output voltage levels to within a given tolerance. These resistance values can also be selected to obtain a given operating speed. Accordingly, besides saving space, the first embodiment can easily be designed to satisfy a given set of circuit specifications.

These advantages are moreover obtained without the use of an averaging voltage-follower amplifier with parallel differential input stages, thus without the consumption of extra current by the amplifier.

Second Embodiment

Figure 2:
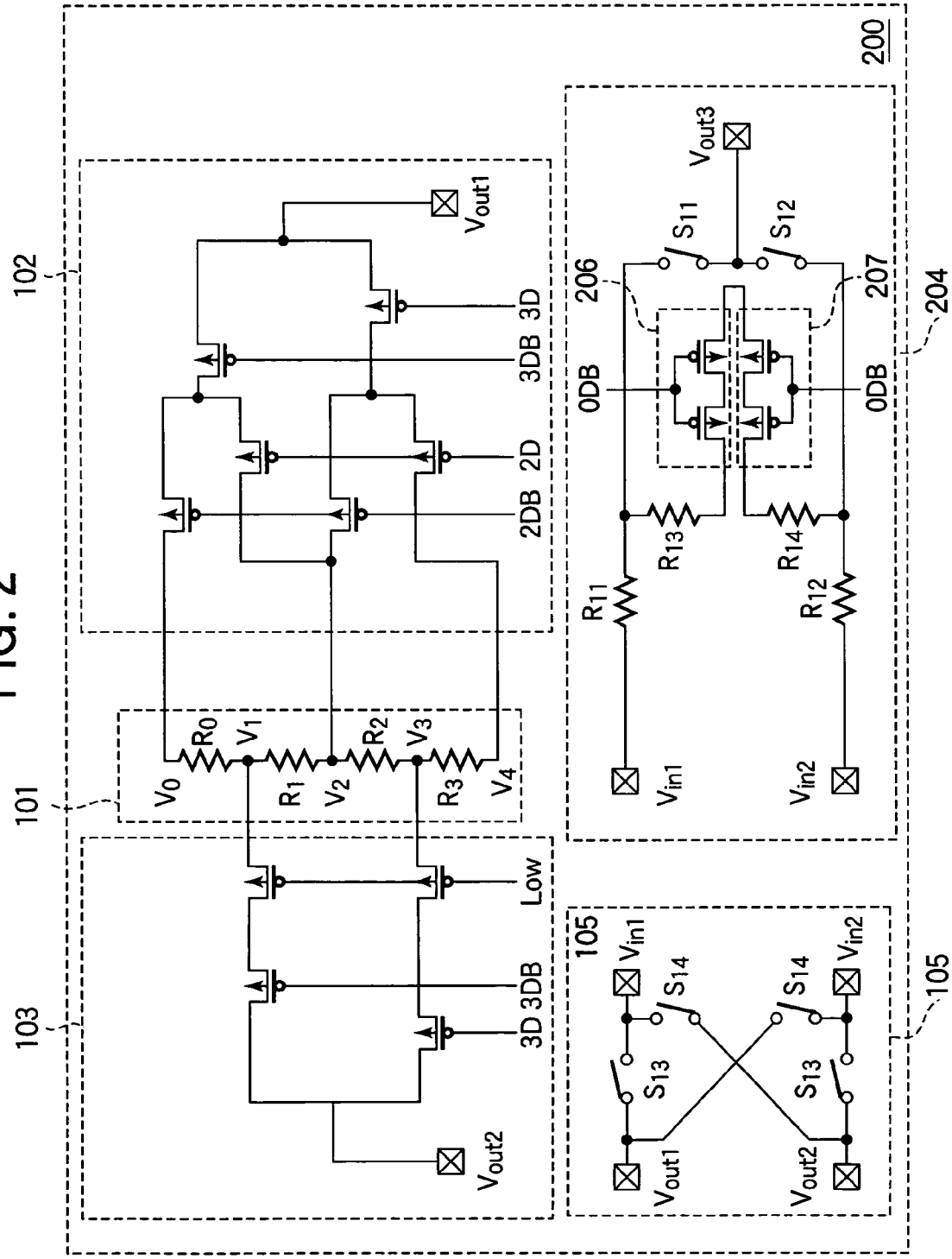
FIG. 2 is a circuit diagram of a D/A converter illustrating a second embodiment.

The second embodiment is a modification of the first embodiment that operates as an (n+1)-bit D/A converter. In the example shown in FIG. 2, the second embodiment is a four-bit D/A converter receiving digital data bits 0D, 1D, 2D, 3D, and their complementary values 0DB, 1DB, 2DB, 3DB. The second embodiment has the same voltage generator 101, first control circuit 102, second control circuit 103, and switching circuit 105 as the first embodiment, but has a modified third control circuit 204, described below.

As in the first embodiment, the third control circuit 204 connects the first input $V_{in1}$ to the third output $V_{out3}$ through a first resistor $R_{11}$ and first switch $S_{11}$, and connects the second input $V_{in2}$ to the third output $V_{out3}$ through a second resistor $R_{12}$ and second switch $S_{12}$. In addition, the third control circuit 204 connects a node disposed between the first resistor $R_{11}$ and first switch $S_{11}$ and a node disposed between the second resistor $R_{12}$ and second switch $S_{12}$ through a series circuit including a third resistor $R_{13}$, a third switch 206, a fourth switch 207, and a fourth resistor $R_{14}$. The third and fourth switches 206, 207 comprise the same type of p-channel MOS transistors as used in the first and second control circuits 102, 103, having the same dimensions and fabrication process conditions, but the gate electrodes of the p-channel MOS transistors in the third and fourth switches 206, 207 receive the complementary value 0DB of the least significant bit of the input data.

The first switch $S_{11}$ is controlled by the second least significant bit 1D and its complementary value 1DB (not shown). The second switch $S_{12}$ is controlled by the two least significant bits 0D, 1D and their complementary values 0DB, 1DB. The switches $S_{13}$, $S_{14}$ in the switching circuit 105 are again controlled by bit 2D, which is now the third least significant bit, and its complementary value 2DB.

The operation of the second embodiment will now be described under the assumption that the on-resistance values of the p-MOS transistors in the third and fourth switches 206, 207 are negligibly small in comparison with the resistances of the third and fourth resistors $R_{13}$, $R_{14}$.

When 1D=0 and 0D=0 (0DB=1), the second switch $S_{12}$ is turned on and the first, third, and fourth switches $S_{11}$, 206, and 207 are turned off, so the second input $V_{in2}$ is output directly as the third output $V_{out3}$.

When 1D=0 and 0D=1 (0DB=0), the second, third, and fourth switches $S_{12}$, 206, and 207 are turned on and the first switch $S_{11}$ is turned off, so the third output $V_{out3}$ is a voltage higher than the second input voltage $V_{in2}$ by one quarter of the voltage difference between the first and second inputs $V_{in1}$ and $V_{in2}$.

When 1D=1 and 0D=0, the first and second switches $S_{11}$ and $S_{12}$ are turned on and the third and fourth switches 206 and 207 are turned off, so the third output $V_{out3}$ is a voltage halfway between the first and second input voltages $V_{in1}$ and $V_{in2}$.

When 1D=1 and 0D=1, the first, third, and fourth switches $S_{11}$, 206, and 207 are turned on and the second switch $S_{12}$ is turned off, so the third output $V_{out3}$ is a voltage higher than the second input voltage $V_{in2}$ by three-quarters of the voltage difference between the first and second inputs $V_{in1}$ and $V_{in2}$.

The output voltages $V_{out1}$, $V_{out2}$, $V_{out3}$ have the values shown in Table 2.

TABLE 2

| Input | $V_{out1}$ | $V_{out2}$ | $V_{out3}$ |
|---|---|---|---|
| 1111 | $V_0$ | $V_1$ | $(3V0 + V_1)/4$ |
| 1110 | $V_0$ | $V_1$ | $(V_0 + V_1)/2$ |
| 1101 | $V_0$ | $V_1$ | $(V_0 + 3V1)/4$ |
| 1100 | $V_0$ | $V_1$ | $V_1$ |
| 1011 | $V_2$ | $V_1$ | $(3V1 + V_2)/4$ |
| 1010 | $V_2$ | $V_1$ | $(V_1 + V_2)/2$ |
| 1001 | $V_2$ | $V_1$ | $(V_1 + 3V2)/4$ |
| 1000 | $V_2$ | $V_1$ | $V_2$ |
| 0111 | $V_2$ | $V_3$ | $(3V2 + V_3)/4$ |
| 0110 | $V_2$ | $V_3$ | $(V_2 + V_3)/2$ |
| 0101 | $V_2$ | $V_3$ | $(V_2 + 3V_3)/4$ |
| 0100 | $V_2$ | $V_3$ | $V_3$ |
| 0010 | $V_4$ | $V_3$ | $(3V_3 + V_4)/4$ |
| 0011 | $V_4$ | $V_3$ | $(V_3 + V_4)/2$ |
| 0001 | $V_4$ | $V_3$ | $(V_3 + 3V4)/4$ |
| 0000 | $V_4$ | $V_3$ | $V_4$ |

Controlling the third control circuit 204 by the lower two bits of the digital input data 1D and 0D makes it possible to generate three additional voltage levels from the first and second inputs $V_{in1}$ and $V_{in2}$, thereby obtaining five voltage levels in all from two adjacent reference voltages generated by the resistor string in the voltage generator 101.

Since the third and fourth switches that are inserted in the third control circuit 204 to increase the number of voltage gradations use the same type of MOS transistors as in the first and second control circuits 102 and 103, they have the same on-resistance, back bias, and other characteristics. This uniformity of characteristics improves the accuracy of the output voltage levels. In particular, the voltage difference between two adjacent reference voltages output by the voltage generator 101 is divided into four equal parts because the combined resistance of the first control circuit and resistor $R_{11}$ (or $R_{12}$), the combined resistance of the second control circuit and resistor $R_{12}$ (or $R_{11}$), the combined resistance of the third switch and resistor $R_{13}$, and the combined resistance of the fourth switch and resistor $R_{14}$ are all equal.

Like the first embodiment, the second embodiment can be extended to an arbitrary number (n) of data bits by modifying the first and second control circuits 102, 103, without changing the topology of the switching circuit 105 and third control circuit 204.

Compared with the first embodiment, the second embodiment obtains twice as many output voltage levels from only a slightly larger number of transistors and resistors, adding only two resistors and four transistors to the third control circuit 204.

Compared with the conventional technology illustrated in FIGS. 3 and 4, the second embodiment provides substantial space savings. For n-bit input data, the second embodiment requires a resistor string with only $2^{n-2}$ resistors, one-fourth the conventional number. For large numbers of bits (n=10, for example), the necessary number of transistors is less than half the conventional number. The amount of space saved increases with the number of bits.

Like the first embodiment, the second embodiment can be easily designed to reduce voltage error to a specified level, and to provide a specified operating speed, and does not require amplifiers with high current consumption.

The invention is not limited to the embodiments described above. For example, by adding further resistors and transistors to the third control circuit, it is possible to output seven voltage levels between each mutually adjacent pair of reference voltages produced by the voltage generator 101. More generally, the above embodiments can be described as producing $2^n$ output voltage levels from a first string of $2^{n-m}$ resistors having a first resistance and a second string of $2^m$ resistors having a second resistance, where m and n are arbitrary positive integers (0<m<n) and the second resistance is higher than the first resistance, by switchably connecting the second string of resistors in parallel with a selectable one of the resistors in the first string, and selecting one of the voltage levels produced by the second string of resistors.

The multiple transistors with gate electrodes held at the low logic level in the second control circuit 103 can be replaced by a single transistor of the same type disposed on the single signal line leading to the $V_{out2}$ output terminal.

The switching circuit 105 can be omitted: an equivalent function can be provided by suitable control of the first and second switches $S_{11}$, $S_{12}$ in the third control circuit. In the first embodiment, for example, with the first input $V_{in1}$ connected to the first output $V_{out1}$ and the second input $V_{in2}$ connected to the second output $V_{out2}$, the first switch may be turned on whenever either bit 1D or bit 2DB is one (1D=1 or 2DB=1), the second switch being turned on whenever either bit 1D or bit 2D is one (1D=1 or 2D=1).

The third and fourth resistors $R_{13}$, $R_{14}$ in the second embodiment can be replaced by a single resistor with a resistance value equal to the combined series resistance of the third and fourth resistors. Similarly, the third and fourth switches 206, 207 can be replaced by a single switch having an on-resistance equal to the combined on-resistances of the third and fourth switches.

The resistors may be resistance elements of any type.

Those skilled in the art will recognize that further variations are possible within the scope of invention, which is defined by the appended claims.

What is claimed is:

1. A digital-to-analog (D/A) converter comprising:
   a voltage generator using voltage drops in resistors to generate a plurality of reference voltages forming a monotonic sequence of voltage levels;
   a first control circuit for selecting an arbitrary one of the plurality of reference voltages as a first output;
   a second control circuit for selecting another one of the plurality of reference voltages, adjacent in the monotonic sequence to the one of the plurality of reference voltages selected by the first control circuit, as a second output; and
   a third control circuit for generating a third output from the first output and the second output, having a first resistor and a first switching device connected in series between the first output and the third output, and a second resistor and a second switching device connected in series between the second output and the third output;
   wherein the reference voltages are numbered by consecutive integers in order of the monotonic sequence;
   the first output is an even-numbered reference voltage; and
   the second output is an odd-numbered reference voltage.

2. The D/A converter of claim 1, wherein the first resistor and the second resistor have equal resistance values.

3. The D/A converter of claim 1, wherein the first control circuit and the second control circuit have equal series resistance values when conducting current.

4. A digital-to-analog (D/A) converter comprising:
   a voltage generator using voltage drops in resistors to generate a plurality of reference voltages forming a monotonic sequence of voltage levels;
   a first control circuit for selecting an arbitrary one of the plurality of reference voltages as a first output;
   a second control circuit for selecting another one of the plurality of reference voltages, adjacent in the monotonic sequence to the one of the plurality of reference voltages selected by the first control circuit, as a second output; and
   a third control circuit for generating a third output from the first output and the second output, having a first resistor and a first switching device connected in series between the first output and the third output, and a second resistor and a second switching device connected in series between the second output and the third output;
   wherein when conducting current, the first control circuit and the first resistor have a combined series resistance at least ten thousand times higher than a resistance of any one of the resistors in the voltage generator.

5. A digital-to-analog (D/A) converter comprising:
   a voltage generator using voltage drops in resistors to generate a plurality of reference voltages forming a monotonic sequence of voltage levels;
   a first control circuit for selecting an arbitrary one of the plurality of reference voltages as a first output;
   a second control circuit for selecting another one of the plurality of reference voltages, adjacent in the monotonic sequence to the one of the plurality of reference voltages selected by the first control circuit, as a second output; and a third control circuit for generating a third output from the first output and the second output, having a first resistor and a first switching device connected in series between the first output and the third output, and a second resistor and a second switching device connected in series between the second output and the third output:

wherein the third output is supplied to an amplifier having a predetermined input capacitance C and a predetermined maximum input rise time T, and the combined series resistance of the first resistor and the first control circuit when conducting current is at most $T/(C \cdot \ln 10)$.

6. A digital-to-analog (D/A) converter comprising:
a voltage generator using voltage drops in resistors to generate a plurality of reference voltages forming a monotonic sequence of voltage levels;
a first control circuit for selecting an arbitrary one of the plurality of reference voltages as a first output;
a second control circuit for selecting another one of the plurality of reference voltages, adjacent in the monotonic sequence to the one of the plurality of reference voltages selected by the first control circuit, as a second output; and
a third control circuit for generating a third output from the first output and the second output, having a first resistor and a first switching device connected in series between the first output and the third output, and a second resistor and a second switching device connected in series between the second output and the third output, a first node disposed between the first resistor and the first switching device, a second node disposed between the second resistor and the second switching device, and a series circuit including at least one resistor and at least one switching device connected in series between the first node and the second node.

7. The D/A converter of claim 6, wherein the series circuit comprises:
a third resistor;
a third switching device;
a fourth switching device; and
a fourth resistor.

8. The D/A converter of claim 7, wherein the first and third resistors have mutually identical resistances, and the second and fourth resistors have mutually identical resistances.

9. The D/A converter of claim 7, wherein:
the first control circuit and the third switching device have mutually identical resistances when conducting current; and
the second control circuit and the fourth switching device have mutually identical resistances when conducting current.

10. The D/A converter of claim 9, wherein the first control circuit, the second control circuit, the third switching device, and the fourth switching device comprise metal-oxide-semiconductor (MOS) transistors, all of the MOS transistors constituting the first control circuit, the second control circuit, the third switching device, and the fourth switching device having identical dimensions.

11. The D/A converter of claim 10, wherein:
current flowing through the first control circuit and the third switching device flows through equal numbers of MOS transistors in the first control circuit and the third switching device; and
current flowing through the second control circuit and the fourth switching device flows through equal numbers of MOS transistors in the second control circuit and the fourth switching device.

12. A D/A converter comprising:
a first resistor string comprising a first plurality of resistors coupled in series to generate a first plurality of voltage levels from a first pair of supplied voltages;
a second resistor string comprising a second plurality of resistors coupled in series to generate a second plurality of voltage levels from a second pair of supplied voltages, the resistors in the second resistor string have having a resistance higher by at least a factor of one thousand than the resistors in the first resistor string; and
a control circuit for connecting the second resistor string to the first resistor string in parallel with a selectable one of the resistors in the first resistor string, so that the second pair of supplied voltages are two of the voltage levels in the first plurality of voltage levels, and selecting one of the second plurality of voltage levels as an output voltage.

13. A D/A converter comprising:
a first resistor string comprising a first plurality of resistors coupled in series to generate a first plurality of voltage levels from a first pair of supplied voltages, the voltage levels in the first plurality of voltage levels being numbered by consecutive integers in increasing voltage sequence;
a second resistor string comprising a second plurality of resistors coupled in series to generate a second plurality of voltage levels from a second pair of supplied voltages, the second resistor string having two ends,
a control circuit for connecting the second resistor string to the first resistor string in parallel with a selectable one of the resistors in the first resistor string, so that the second pair of supplied voltages are two of the voltage levels in the first plurality of voltage levels, and selecting one of the second plurality of voltage levels as an output voltage, the control circuit including:
a first control circuit connected to the first resistor string, for selecting an arbitrary even-numbered one of the first plurality of voltage levels and supplying the selected voltage level to one of the two ends of the second resistor string;
a second control circuit connected to the first resistor string, for selecting an arbitrary odd-numbered one of the first plurality of voltage levels and supplying the selected voltage level to another one of the two ends of the second resistor string;
an output terminal; and
a third control circuit for connecting a selectable node in the second resistor string to the output terminal.

14. The D/A converter of claim 13, wherein the control circuit further comprises a switching circuit for interchanging the connections of the first and second control circuits to the second resistor string.

15. The D/A converter of claim 13, wherein the second resistor string includes a first resistor disposed at said one of the two ends of the second resistor string and a second resistor disposed at said another one of the two ends of the second resistor string, and the third control circuit comprises:
a first switching device for selectively connecting the first resistor to the output terminal; and
a second switching device for selectively connecting the second resistor to the output terminal.

16. The D/A converter of claim 15, wherein:
the second resistor string also has a third resistor connected in series between the between the first and second resistors; and
the third control circuit further comprises a third switching device connected in series with the third resistor between the first and second resistors.

17. The D/A converter of claim 15, wherein:
the second resistor string also has a third resistor and a fourth resistor connected in series between the first and second resistors;
the first, second, third, and fourth resistors have mutually identical resistance values;
the third control circuit further comprises a third switching device and a fourth switching device connected in series with the third and fourth resistors between the first and second resistors; and
the first control circuit, the second control circuit, the third switching device, and the fourth switching device have mutually identical on-resistance values.

18. The D/A converter of claim 4, wherein the first resistor and the second resistor have equal resistance values.

19. The D/A converter of claim 4, wherein the first control circuit and the second control circuit have equal series resistance values when conducting current.

20. The D/A converter of claim 5, wherein the first resistor and the second resistor have equal resistance values.

21. The D/A converter of claim 5, wherein the first control circuit and the second control circuit have equal series resistance values when conducting current.

22. The D/A converter of claim 6, wherein the first resistor and the second resistor have equal resistance values.

23. The D/A converter of claim 6, wherein the first control circuit and the second control circuit have equal series resistance values when conducting current.

* * * * *